US006347392B1

(12) United States Patent
Gaultier

(10) Patent No.: US 6,347,392 B1
(45) Date of Patent: Feb. 12, 2002

(54) METHOD FOR THE CONTROL OF AN ELECTRONIC CIRCUIT AND CONTROL UNIT FOR ITS IMPLEMENTATION

(75) Inventor: Jean-Marie Gaultier, Rousset (FR)

(73) Assignee: STMicroelectronics S.A., Gentilly (FR)

(*) Notice: Subject to any disclaimer, the term of this patent is extended or adjusted under 35 U.S.C. 154(b) by 0 days.

(21) Appl. No.: 09/216,234

(22) Filed: Dec. 18, 1998

(30) Foreign Application Priority Data

Dec. 19, 1997 (FR) ............................................. 97 16193

(51) Int. Cl.[7] .......................... G06F 17/50; G06F 9/312; H03K 19/00; H03M 13/37; G05F 1/06
(52) U.S. Cl. ........................... 716/1; 714/759; 712/209; 712/224; 712/226; 326/16; 326/38; 326/47; 326/105; 327/107; 327/334; 327/520
(58) Field of Search ....................... 716/1–21; 714/759; 712/208–209, 223–224, 226; 326/16, 37–38, 47, 105; 327/105, 107, 334, 520

(56) References Cited

U.S. PATENT DOCUMENTS

| | | | |
|---|---|---|---|
| 4,638,481 A | | 1/1987 | Crane et al. ................. 714/743 |
| 4,701,920 A | * | 10/1987 | Resick et al. .................. 326/38 |
| 4,791,602 A | * | 12/1988 | Resnick ........................ 326/38 |
| 5,241,161 A | | 8/1993 | Zuta ........................... 235/382 |
| 5,481,471 A | * | 1/1996 | Naglestad et al. .............. 716/4 |
| 5,627,842 A | * | 5/1997 | Brown et al. ................ 714/727 |
| 5,682,496 A | | 10/1997 | Roohparvar ................. 711/103 |
| 5,706,473 A | * | 1/1998 | Yu et al. ........................ 716/4 |
| 5,805,931 A | * | 9/1998 | Morzano et al. .............. 710/64 |
| 5,852,726 A | * | 12/1998 | Lin et al. ..................... 712/200 |
| 5,859,993 A | * | 1/1999 | Snyder ....................... 712/208 |
| 5,870,586 A | * | 2/1999 | Baxter ......................... 716/16 |
| 6,011,546 A | * | 1/2000 | Bertram ...................... 345/327 |
| 6,078,736 A | * | 6/2000 | Guccione .................... 716/16 |
| 6,167,363 A | * | 12/2000 | Stapleton ..................... 703/14 |
| 6,279,116 B1 | * | 8/2001 | Lee ............................ 713/601 |

OTHER PUBLICATIONS

NN7508830 ("Transmission Line Adapter Implementation Using Programmable Logic Arrays", IBM Technical Disclosure Bulletin, Document No. NN7508830, vol. 18, No. 3, pp. 830–834 (1–6), Aug. 1975).*
Moss, B. "A Flexible Size 3–Wire Serial EEPROM Interface", Motorola Technical Developments, vol. 21, Feb. 1, 1994, pp. 23–26.
French Search Report dated Aug. 18, 1998 with annex on French Application No. 97-16193.

* cited by examiner

Primary Examiner—Matthew Smith
Assistant Examiner—Phallaka Kik
(74) Attorney, Agent, or Firm—Lisa K. Jorgenson; Stephen Bongini; Fleit, Kain, Gibbons, Bongini & Gutman P.L.

(57) ABSTRACT

A method for the control of an electronic circuit of the type includes at least one access pin to receive and/or deliver control signals, includes the generation, in a control unit, of control signals from data elements received serially through a data transfer input/output device. The method also includes the following steps: (1) extracting a control word included in the data received serially; and (2) decoding the control word extracted in the previous step in order to perform an operation, as a function of the value of the control word, thus modifying the logic state of at least one control signal. A control unit for accomplishing the foregoing steps includes a circuit for the extraction of a control word included in data elements received serially through a means for the serial transfer of data in the electronic circuit; a circuit for the decoding of said control word; and two or more of flip-flop circuits controlled by activation signals generated by the decoding circuit, the logic state of the output of the flip-flop circuits directly or indirectly determining the logic state of the control signals generated by the control unit.

11 Claims, 3 Drawing Sheets

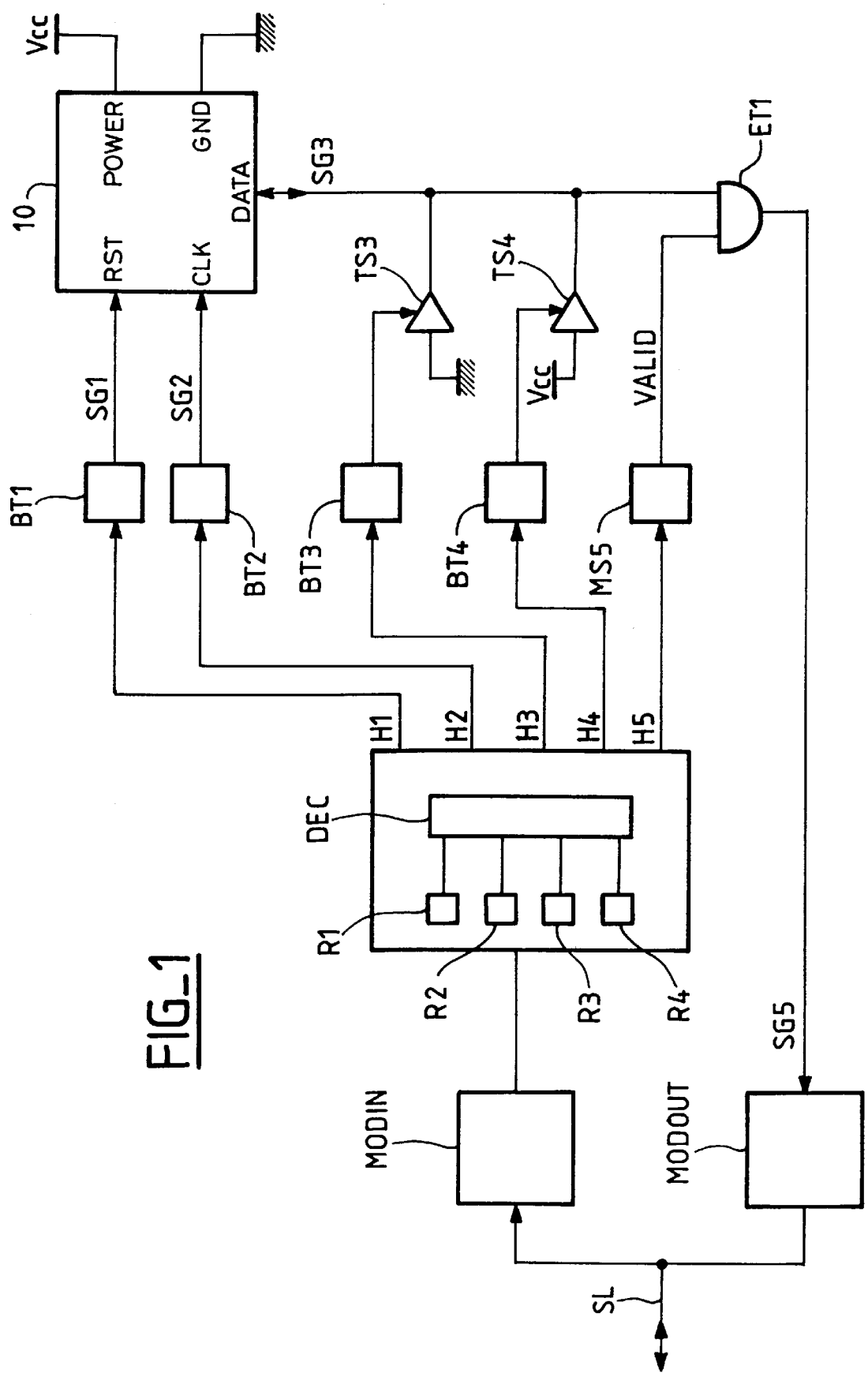
FIG_1

| WORD | VALUE |
|---|---|
| START | 1110 |
| STOP | 0000 |
| RESET | 0101 |
| CLOCK | 0110 |
| IOIN0 | 0010 |
| IOIN1 | 0011 |
| IOOUT | 0100 |
| NOACT | 1111 |
FIG_2
| STEP | WORD |
|---|---|
| 1 | START |
| $2_1$ | CLOCK |
| $3_1$ | CLOCK |
| $2_2$ | CLOCK |
| $3_2$ | CLOCK |
| $2_3$ | CLOCK |
| $3_3$ | CLOCK |
| ⋮ | ⋮ |
| $2_{i-1}$ | CLOCK |
| $3_{i-1}$ | CLOCK |
| $2_i$ | CLOCK |
| $3_i$ | CLOCK |
| 4 | IOIN0 |
| 5 | RESET |
| 6 | CLOCK |
| 7 | CLOCK |
| 8 | RESET |
| 9 | IOIN0 |
| 10 | STOP |
FIG_3
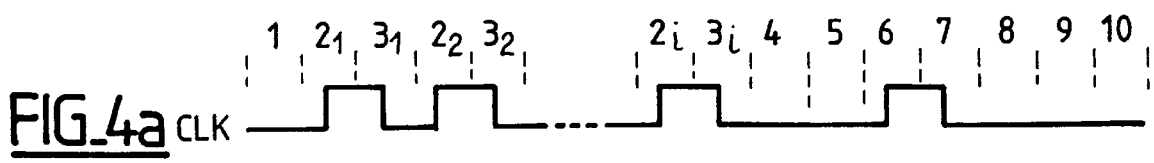
FIG_4a CLK
FIG_4b DATA
FIG_4c RST

| STEP | WORD |
|---|---|
| 1 | START |
| $2_1$ | CLOCK |
| $3_1$ | CLOCK |
| $2_2$ | CLOCK |
| $3_2$ | CLOCK |
| $2_3$ | CLOCK |
| $3_3$ | CLOCK |
| ⋮ | ⋮ |
| $2_{i-1}$ | CLOCK |
| $3_{i-1}$ | CLOCK |
| $2_i$ | CLOCK |
| $3_i$ | CLOCK |
| 4 | IOOUT |
| 5 | RESET |
| 6 | RESET |
| 7 | STOP |
FIG_5
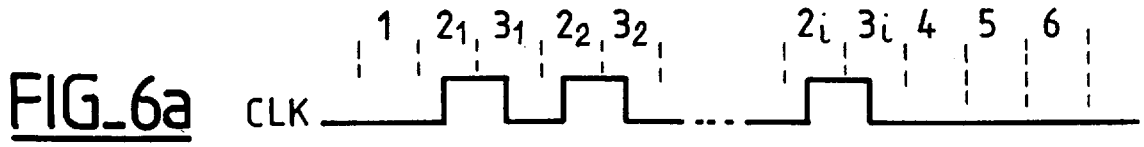
FIG_6a  CLK
FIG_6b  VALID
FIG_6c  RST

METHOD FOR THE CONTROL OF AN ELECTRONIC CIRCUIT AND CONTROL UNIT FOR ITS IMPLEMENTATION

CROSS-REFERENCE TO RELATED APPLICATIONS

This application is based on and claims the benefit of priority of the prior French Patent Application No. 9716193 filed on Dec. 19, 1997, the contents of which are hereby incorporated by reference.

BACKGROUND OF THE INVENTION

1. Field of the Invention

The present invention relates to a method for the control of an electronic circuit of the type comprising at least one access pin to receive and/or deliver control signals as well as a control unit for the implementation of said method.

2. Discussion of the Related Art

It is known that the devising, designing and manufacture of a circuit of this kind is very costly. First of all, the circuit has to be defined from a functional viewpoint. Then it has to be simulated by means of computer-assisted design software. Then, it is necessary to prepare the pattern of the masks needed to make the circuit physically on an integrated circuit substrate of silicon. Finally, it still has to be tested once it has been integrated into a plastic package.

This is why the manufacturers of integrated circuits often make new products out of prior products by adapting them so as to modify only what is strictly necessary.

There are also known ways of making applications specific integrated circuits (ASICs) by assembling a plurality of functional blocks taken out of a collection of drawings of elementary circuits (a "library of drawings" in the language of those skilled in the art). The advantage lies in the fact that the drawing of the functional blocks is designed and validated in advance. Similarly, the test vectors to be used to verify the efficient operation of the circuit are known and can be used again to test the integrated circuit block by block. Only new test vectors must be created to check that the assembly works efficiently. All this helps reduce development time and, therefore, the cost of a new integrated circuit.

However, it may happen that an existing integrated circuit or a functional block available in a library of drawings, while it corresponds functionally to the specifications of a new circuit to be designed, cannot be used again in an identical form within the framework of a new application. This may be the case for example when the earlier circuit is a logic circuit that is controlled by or delivers electrical signals whose levels of voltage are incompatible with those of the application envisaged. The earlier circuit may also be one that communicates with the exterior according to a specific protocol which cannot be implemented in the new application envisaged. Those skilled in the art will then be required to substantially modify the earlier circuit or the available functional block which, in practice, takes up almost as much time and is almost as expensive as developing a completely new circuit. Now these costs may weigh very heavily in the cost of manufacture of a new integrated circuit especially if the quantities to be produced are too small to enable these costs to be recouped in the long term.

Accordingly, an object of the invention is the re-utilization, without modification, of the design of an electronic circuit of the type in applications where the integrated circuit cannot be controlled by means of n sources of control signals (n being strictly greater than one) but, on the contrary, through a single means for the serial transfer of data.

SUMMARY OF THE INVENTION

In accordance with an aspect of the invention, a method and device for the control of a circuit having at least one control I/O comprises the generation, in a control unit, of said control signals from data received serially through a means for the serial transfer of data. To this end, the method of controlling according to the invention comprises the following steps:

a) extraction of a control word included in the data received serially;

b) decoding of the control word extracted in the previous step in order to perform an operation, as a function of the value of the control word for modifying the logic state of at least one control signal.

BRIEF DESCRIPTION OF THE DRAWINGS

FIG. 1 is a drawing of a control unit according to the invention.

FIG. 2 is a table giving the definition and value of control words according to the invention.

FIG. 3 shows a sequence of control words used to perform an operation in the electronic circuit according to the method of the invention.

FIGS. 4a to 4c are timing diagrams of control signals corresponding to the sequence of FIG. 3.

FIG. 5 shows a sequence of control words for the performance of another operation according to the method of the invention.

FIGS. 6a to 6c are timing diagrams of control signals corresponding to the sequence of FIG. 5.

DETAILED DESCRIPTION OF AN EMBODIMENT

The invention can be applied to the designing of electronic systems, especially systems that incorporate digital electronic circuits.

FIG. 1 shows a possible embodiment of a control or management unit according to the principles of the invention. This control unit is positioned between, first, a means for the serial transmission of data, herein represented by a line SL and, secondly, an electronic circuit 10 such as a telephone card memory.

The line SL may directly be a two-way data transfer line which, as the case may be but not necessarily, carries out a two-way transfer of data. In particular, it may be a wire link (made of copper) or an optical fiber. It may also be a link to an antenna, preferably a transceiver antenna for the serial transfer of data by wireless means, especially in the radiofrequency band (RF link).

An embodiment of the invention is a telephone card memory which, according to a French standard, is controlled (or managed) from the exterior through a plurality of contact pins (e.g. five), one of these pins being connected to a positive supply voltage source while another is connected to ground. It is therefore by means of three access pins that the circuit receives or delivers control signals.

The control unit that implements the above method therefore has the function of an interface between, first, the serial data transfer means and, secondly, the electronic circuit accessible by means of its access pins. Thus, the electronic circuit may be used without any modification of its structure, despite the fact that it is controlled by a control station at a distance, such as for example a microprocessor with which it communicates through the serial data transmission means according to a specified type of serial transmission protocol.

According to an advantageous characteristic of the invention, with the control signal being generated in order to be transmitted on an adapted input of the electronic circuit, two successive identical operations have the effect respectively of making the concerned control signal go from a first logic state to a second logic state that is different from the first one, and of making it go back to the logic state in which it was originally. This arrangement enables the transitions 1>0 and 0>1 of the control signals to be managed by means of a single control word. The efficiency of the protocol, which can be expressed as the number of different actions capable of being controlled with a specified format and message size, is thus improved.

In the example described, the circuit 10 has five contact pins. A first pin POWER receives a potential that is none other than a positive supply potential Vcc delivered by a power supply source. Another pin GND is connected to a negative supply potential or to the ground. Finally, the other three pins are access pins to receive and/or deliver control signals for the circuit 10. For a telephone card memory according to the French standard, which is the object of the present exemplary embodiment of the invention, the following are the three control signals:

a signal SG1 which is a control signal received by the memory 10 on an input RST; this signal may have two specified complementary logic values 0 or 1;

a signal SG2 which is a clock signal received by the memory at another clock input CLK; this signal may also have two specified complementary logic values 0 or 1; the leading edges of this clock signal set the pace of the operation of the memory 10;

a data signal SG3 received or delivered by the memory 10 on a data input/output pin DATA; this signal may be generated by the control unit in order to be transmitted to the pin DATA then working as an input of the memory (signal SG3); it may also be generated in order to be transmitted by the control unit on the data transfer means SL, in which case the pin DATA works as an output of the memory (signal SG5); the means SL is then a two-way transfer means.

The control unit comprises an input module MODIN comprising means for the extraction of a control word included in the data received serially through the means SL.

In one example, the control word is encoded on four bits. The value of the four bits of a control word extracted from the data received is saved, respectively, in four storage registers R1 to R4. The output of these registers is given to the input of a decoder DEC which decodes the control word. A decoder of this kind conventionally comprises combinational circuits such as NAND, NOR, or other types of logic gates. The decoding means thus formed by the registers R1 to R4 and the decoder DEC generate activation signals as a function of the value of the control word. In other words, certain activation signals are activated and, in the example only one at a time of the five activation signals H1 to H5 shown is activated, for certain specified values of the control word received. By convention, it shall be said hereinafter that any signal is active when it is in the logic 1 state.

The activation signals H1 to H5 have the function of prompting an operation that modifies the state of the control signals SG1, SG2, SG3, and SG5 generated by the control unit as shall be described hereinafter.

The control unit has flip-flop circuits BT1–BT4 and MS5 controlled by the activation signals H1 to H5 respectively. The logic state of the output of these flip-flop circuits directly or indirectly determines the logic state of the control signals generated. It is therefore the function of these flip-flop circuits to directly or indirectly determine the logic state of the control signals and, at the same time, to hold this state for as long as the flip-flop circuit is held in a corresponding logic state.

The output of the flip-flop circuit BT1 is connected to the pin RST of the circuit 10. The output of the flip-flop circuit BT2 is connected to the input CLK of the circuit 10. The logic state of the control signals SG1 and SG2 generated at output of the flip-flop circuit BT1 and BT2 respectively is therefore determined directly by the logic state of the output of said flip-flop circuits. In fact, these are the same logic states.

The output of the flip-flop circuit BT3 is connected to the control terminal of a first three-state logic gate TS3 whose input is taken permanently to the logic 0 value (it is connected to the ground) and whose output is connected to the pin DATA of the circuit 10. Similarly, the output of the flip-flop circuit BT4 is connected to the control terminal of a second three-state logic gate TS4 whose input is taken permanently to the logic 1 value (it is connected to the potential source Vcc) and whose output is connected to the input DATA just like that of the gate ST3.

With these connections, the control signal SG3 generated by the control unit in order to be transmitted on the pin DATA, which is delivered by the common outputs of the gates TS3 and TS4, has the following logic levels:

when the activation signal H3 is active, the gate TS3 is closed and the control signal SG3 is in the logic 0 state;

when the activation signal H4 is active, the gate TS4 is closed and the control signal SG3 is in the logic 1 state;

when neither H3 nor H4 is active, the gates TS3 and TS4 are open and their common outputs are in an indeterminate logic state, namely the state HIZ called the "high impedance" state (unless of course, as shall be seen hereafter, it is the contents of the memory through the pin DATA that dictate a specified logic state).

It will be noted that the case where H3 and H4 are simultaneously active is prohibited through the wiring of the combinational means of the decoder DEC, so that there is no danger of any conflict between the outputs of the gates TS3 and TS4. The logic state of the control signal SG3 is herein determined indirectly by the logic state of the activation signals H3 and H4 inasmuch as it depends firstly on the state of the gates TS3 and TS4, namely whether they are open or closed, and secondly on the input logic state of that one of these gates which is closed as the case may be.

According to an advantageous characteristic, the flip-flop circuits BT1 to BT4 are T-type flip-flop circuits which have the particular feature of changing their state at output whenever a leading edge occurs at their clock input. The activation signals H1 to H4 are transmitted to the clock inputs of the flip-flop circuits BT1 to BT4 respectively. As those skilled in the art are quite aware, a T-type flip-flop circuit can easily be made by means of an RS type flip-flop circuit or JK type flip-flop circuit having both its inputs R and S or J and K respectively taken to the potential Vcc.

The advantage of a T-type flip-flop circuit lies in the fact that, starting from a specified logic state at output of each flip-flop circuit BT1 to BT4, two identical operations performed in succession (but interrupted as the case may be by one or more operations of a different kind) have the effect, respectively, of making the control signal concerned by these operations pass from a first logic state to a second logic state, and of making it pass again into its original logic state.

This is advantageous for, with one and the same control word, RESET or CLOCK respectively, it is possible to control both the leading transition 0>1 and the trailing transition 1>0 of the control signal SG1 or clock signal SG2. The operation performed at reception of one of these control words thus consists in making the concerned control signal switch over from a specified logic 0 state or logic 1 state in which it occurs into the reverse (or complementary) logic state of this signal.

Similarly, with regard to the control signal SG3, the successive repetition of one and the same control word IOIN0 or IOIN1 gives rise to the operation in which the control signal SG3 is made to go into a specified logic state, 0 or 1 respectively, when it is in the indeterminate logic state HIZ and then conversely of making it go into the indeterminate logic state HIZ when it is in a specified logic 0 state or logic 1 state.

The advantage resulting from the scheme described here above lies in the fact that it restricts the number of different control words that the decoder DEC is capable of decoding. It thus becomes possible to optimize the efficiency of the serial communication protocol between the distant control station (not shown) and the control unit for the transfer of control data through the transfer means SL.

By way of an example, FIG. 2 gives a table of eight different control words. The names of these words, as used in the present description, is shown in the left-hand column and their value encoded on four bits is shown in the right-hand column. For maximum efficiency of the protocol, it is obviously possible to encode the value of the eight control words on three bits instead of four as planned. However, with four bits, it is possible to choose values which, in taking account also of the physical factors that come into play in the transfer of data on the means SL, minimize the risk of decoding errors.

The output of the flip-flop circuit MS5 is connected to a first input of an AND type gate ET1 whose second input is connected to the input/output pin DATA of the circuit 10. The output of the gate ET1 delivers the control signal SG5 generated by the control unit in order to be transmitted by this unit on the means SL. This is a data signal. The logic state of the signal SG5, here too, is indirectly determined, firstly, by the logic state of the output of the flip-flop circuit BT5 controlled by the activation signal H5 and, secondly, by the logic state of the pin DATA working as an output of the memory 10 in read mode.

It will have been understood that, starting from an initial state where the output of the flip-flop BT5 is in the logic 0 state, the operation performed by the control unit, after the decoding of the control word IOOUT extracted from the data received, consists in placing the control signal SC5 in a specified logic state as a function of the logic state of the pin DATA. With an AND type gate ET1, what is done is to copy the logic state of the output DATA. But with a NAND type gate, it would be a reversal of this logic gate.

Indeed, it will be observed that the nature of the gate ET1 shown herein (namely an AND type logic gate) must be understood as an example among others that can equally well fulfil the function allocated to this gate. In particular, it is possible to think of a NAND type logic gate, a three-state logic gate or again a well-arranged multiplexer.

The signal SG5 generated at output of the gate ET1 is transmitted to an input of an output module MODOUT comprising means for the shaping of the signal SG5 so that it can be transmitted on the serial data transfer means SL.

Both the module MODOUT and the module MODIN are suited to the nature of the data transfer means SL and to the format of the messages respectively transmitted or received. For example, it might be briefly said (as these modules are not in themselves proper to the invention) that, for a means SL comprising the ambient space as a medium of transmission by an amplitude-modulated radiofrequency carrier wave, the input module MODIN comprises a demodulator, a filter, a rhythm recovery circuit, a sample-and-hold circuit, registers, logic circuits, etc. The output module MODOUT for its part, in this example, comprises a message-shaping circuit, an oscillator to generate the carrier wave, a modulator, an amplifier, etc. The means SL contains at least one antenna, preferably only one for the transmission and reception of data by amplitude-modulated carrier waves through the ambient air. As a alternative, it is possible to provide for one antenna for transmission and another distinct antenna for reception.

The flip-flop circuit MS5 is preferably a monostable flip-flop circuit, for example one whose single stable state is the logic 0 state and is put in its complementary unstable state for a specified duration, upon reception of a leading edge at its activation input. In this way, it is seen to it that the control unit cannot remain irrevocably in the operational state corresponding to the transmission of the data signal SG5 an that it will itself return to a standby state to receive other control words at the end of this time lag. Thus, the risk of blocking the control unit is averted. This risk is particularly present when the serial data transfer means SL comprise a single channel for either direction of transfer (as in the case of the two-way transfer means).

FIG. 3 gives a view, in the form of a table, of a sequence of control words that must be successively transmitted to the control unit to obtain an operation for writing a logic 0 in the $i^{th}$ register of the stack of the memory 10. The left-hand column shows the number of steps needed for this operation. The right-hand column indicates, by name, the control word to be transmitted (see FIG. 2).

In the step 1, first of all, a word START is transmitted. This word awakens the circuits of the control unit and of the memory 10 which had been placed in a standby state in order to reduce their current consumption. A first transmission of the word CLOCK at the step $2_1$ makes the clock signal SG2 go to the logic 1 state. Thus, a leading edge is generated. This leading edge activates the memory 10. A second transmission of this word CLOCK at the step $3_1$ makes it go back to the logic 0 state to prepare the next leading edge. At each leading edge of the clock signal SG2, an internal stack counter of the memory is incremented. The logic value present in the register of the stack indicated by the value of this counter is then delivered on the pin DATA of the memory 10.

The successive transmission of two words CLOCK is repeated i times to bring the stack counter that has to be indicated to the register that is to be written in.

Then, the word IOIN0 is transmitted at the step 4. This prompts the operation in which the door TS3 is closed so that the signal SG3 goes to the logic 0 state, i.e. the logic 0 value is imposed on the input DATA of the memory 10. Then, the word RESET is then transmitted at the step 5, making the signal SG1 go to the logic 0 state. According to the control protocol proper to the memory 10 of a telephone card, the above conditions enable the writing of the logic 0 value in the $i^{th}$ register of the memory. This writing is done as soon as a leading edge of the signal SG2 comes to the clock input CLK of the circuit 10 of the memory. This is what happens in the step 6 by the transmission of the control word CLOCK. In the steps 7, 8 and 9, the transmission of the words CLOCK, RESET and IONIO enables the clock signal SG2 to be brought to the logic 0 state, the clock signal SG1 to the logic 0 state and the data signal SG3 to the indeterminate logic state HIZ.

The trailing edge of the signal SG1 arriving at the step 8 at the input RST of the memory prompts the resetting of the stack counter of the memory.

At the step 10, the transmission of the control word STOP is used to conclude the writing operation. On receiving this control word, the control unit carries out a number of actions such as for example the resetting of these internal registers R1, R2, R3 and R4 and the placing of those of its components that consume the greatest amount of current in a state of standby.

FIGS. 4a to 4c show timing diagrams of the step-by-step progress of the logic level of the pins CLK, DATA and RST corresponding to the logic state of the control signals SG2, SG3 and SG1 respectively.

It will be noted that the order of the steps 4 and 5 on the one hand and of the steps 8 and 9 on the other hand may be reversed since it does not matter whether it is the signal SG1 or the signal SG3 that gets switched over first.

Furthermore, as will have been understood, an operation to write the logic 1 value cannot be distinguished from an operation to write the logic 0 value as described here above with reference to FIGS. 3 and 4a–4c, except by the fact that the control word IOIN1 must be transmitted instead of the word IOIN0 at the above-mentioned steps 4 and 9.

FIG. 5 gives a view in the form of a table of a sequence of control words to be transmitted to the control unit to perform an operation for reading the logic value saved in the $i^{th}$ register of the memory 10.

The steps 1 to 3$_1$ of FIG. 5 are identical to the corresponding steps of FIG. 3 and enable the read operation to be initialized and the stack pointer of the memory 10 to be positioned on the $i^{th}$ register. It will be recalled that the logic state on the input/output pin DATA of the memory 10 then corresponds to the logic value saved in this $i^{th}$ register.

In the step 4, the transmission of the control word IOOUT makes the signal VALID at output of the flip-flop circuit MS5 go into its unstable state corresponding to the logic 1 value. The logic value present at the input/output pin DATA is then copied at the output of the AND type logic gate ET1 and determines the logic state of the signal SG5. This signal 5 is given at the input of the output module MODOUT with a view to the transmission of this logic data element through the control unit by means of the serial data transfer means SL. With an appropriate sequencing of the control unit, the distant control device can receive and read this data element at the other end of the transfer means SL.

At the steps 5 and 6, the transmission, twice in succession, of the control word RESET enables the generation of a trailing edge at the input RST of the memory, thus prompting the resetting of its internal stack counter.

Finally, in the step 7, the transmission of the control word STOP makes it possible to conclude the read operation in the same way as here above for the write operation.

FIGS. 6a and 6c show timing diagrams used to follow the progress of the voltage levels step by step, at the pin CLK of the memory, the output of the monostable circuit MS5 and the pin RST of the memory respectively, corresponding to the logic state of the signals SG2, VALID and SG1 respectively.

It will be noted that the voltage level at the output of the monostable circuit MS5 decreases with a speed that depends on the time constant of the monostable circuit, and finally gets canceled out (FIG. 6b). There is therefore no need to retransmit the control word IOOUT to bring the VALID signal to the logic 0 state. It will be seen to it of course that the time constant of the monostable circuit is such that the signal VALID is at a voltage level corresponding to the logic state 1 for a duration sufficient to enable the reading and transmission of the data element read in the memory 10.

Finally it can be observed that, in certain cases, one and the same control word could cause several control signals to change their logic state simultaneously.

What is claimed is:

1. A method for control of an electronic circuit of the type comprising at least one access pin to receive and/or deliver control signals, said method comprising:

generating, in a control unit, said control signals from data received serially through a data transfer means;

extracting a control word included in the data received serially;

decoding the control word that was extracted in order to perform a selected operation, as a function of a value of the control word, by changing at least one of the control signals from a first logic state to a second logic state, which is different than the first logic state; and returning the one control signal from the second logic state back to the first logic state upon a next performance of the selected operation, wherein the one control signal is generated in order to be transmitted to an input of the electronic circuit.

2. The method according to claim 1, wherein the one control signal is a control signal or a clock signal generated in order to be transmitted respectively to a control input or a clock input of the electronic circuit, and the first logic state is a logic 0 or logic 1 state and the second logic state is its reverse.

3. A method according to claim 1, wherein the one control signal is a data signal generated in order to be transmitted on a data input/output pin of the electronic circuit, and the first logic state is an indeterminate logic state and the second logic state is a logic 0 or logic 1 state.

4. A method according to any one of the preceding claims, further comprising:

decoding another extracted control word in order to perform a second selected operation, as a function of a value of the control word, by setting a second of the control signals to a specified logic state, the second control signal being a data signal generated in order to be transmitted by the control unit on the data transfer means, wherein the second control signal is set in the specified logic state as a function of the logic state of a data input/output pin of the electronic circuit.

5. A control unit for implementation of a method for controlling an electronic circuit by generating control signals that are supplied to inputs of the electronic circuit, said control unit comprising:

means for extraction of a control word included in data received serially through a means for serial transfer of data;

means for decoding said control word so as to generate activation signals; and a plurality of flip-flop circuits controlled by the activation signals generated by said decoding means, a logic state of an output of each of said flip-flop circuits directly or indirectly determining a logic state of one of the control signals generated by the control unit and supplied to one input of the electronic circuit, wherein the plurality of flip-flip circuits includes at least one T type flip-flop circuit whose input receives one of the activation signals and whose output reverses its logic state each time the one activation signal is generated by the means for decoding, the output directly or indirectly determining the logic state of one of the control signals supplied to the electronic circuit.

6. The control unit according to claim 5, wherein the output of the T type flip-flop circuit is a control signal that is coupled to a control input or a clock input of the electronic circuit.

7. The control unit according to claim 5, wherein the plurality of flip-flip circuits comprises at least two T type flip-flop circuits, the output of each of these two T type flip-flop circuits being connected to a control terminal of a three-state logic gate whose input is taken to a specific logic 0 state or logic 1 state and whose output is connected to a data input/output pin of the electronic circuit.

8. The control unit according to claim 5, wherein the plurality of flip-flops includes a second flip-flop circuit whose output is connected to a first input of an AND logic gate whose second input is connected to a data input/output pin of the electronic circuit and whose output delivers a data signal to be sent out by the control unit on the means for serial transfer of data.

9. The control unit according to claim 8, wherein said second flip-flop circuit is a monostable circuit.

10. A control unit according to claim 5, wherein the electronic circuit is a telephone card memory.

11. A control unit according to claim 5, wherein the means for serial transfer of data is a radiofrequency link.

* * * * *